(12) United States Patent
Yoshikawa (10) Patent No.: US 8,547,117 B2
(45) Date of Patent: Oct. 1, 2013

(54) CAPACITIVE TOUCH PANEL

(75) Inventor: Osamu Yoshikawa, Tokyo (JP)

(73) Assignee: SMK Corporation, Tokyo (JP)

( * ) Notice: Subject to any disclaimer, the term of this patent is extended or adjusted under 35 U.S.C. 154(b) by 219 days.

(21) Appl. No.: 13/251,298

(22) Filed: Oct. 3, 2011

(65) Prior Publication Data

US 2012/0019266 A1     Jan. 26, 2012

Related U.S. Application Data

(63) Continuation of application No. PCT/JP2010/004706, filed on Jul. 23, 2010.

(30) Foreign Application Priority Data

Mar. 4, 2010  (JP) ................................. 2010-047641

(51) Int. Cl.
*G01R 27/26* (2006.01)

(52) U.S. Cl.
USPC ......................................... 324/679; 324/681

(58) Field of Classification Search
USPC .................. 324/658, 679, 681–683
See application file for complete search history.

(56) References Cited

U.S. PATENT DOCUMENTS

| | | |
|---|---|---|
| 2008/0179112 A1 | 7/2008 | Qin et al. |
| 2008/0218489 A1 | 9/2008 | Park et al. |
| 2010/0053097 A1* | 3/2010 | Goh et al. ..................... 345/173 |

FOREIGN PATENT DOCUMENTS

| | | |
|---|---|---|
| JP | 2005-337773 A | 12/2005 |
| JP | 2009-70004 A | 4/2009 |
| JP | 2009-191948 A | 8/2009 |
| WO | 2009/090534 A2 | 7/2009 |

OTHER PUBLICATIONS

Extended European Search Report for application No. EP 10 84 6944, Sep. 21, 2012.

* cited by examiner

*Primary Examiner* — Vincent Q Nguyen (57) ABSTRACT

A capacitive touch panel can select a way of voltage control with a high degree of detection accuracy according to operating environment. In response to approach of an input unit, the stray capacitance of the sensing electrode the input unit approached increases. Accordingly, charge and discharge of the stray capacitances of a plurality of sensing electrodes are controlled, and a sensing electrode the potential change of which is made slow by the increase in stray capacitance and resultant increase in time constant is detected as a sensing electrode the input unit approached. The stray capacitance of a sensing electrode can selectively be controlled either by the charge control or by the discharge control, and optimum one of the controls is selected according to operating environment.

6 Claims, 4 Drawing Sheets

(PRIOR ART)

FIG. 4

CAPACITIVE TOUCH PANEL

CROSS REFERENCE TO RELATED APPLICATION

The contents of the following Japanese patent application and International patent application are incorporated herein by reference:

Japanese Patent Application NO. 2010-047641 filed on Mar. 4, 2010, and

International Patent Application NO. PCT/JP2010/004706 filed on Jul. 23, 2010.

BACKGROUND

1. Technical Field

The invention relates to a capacitive touch panel for comparing the stray capacitances of a plurality of sensing electrodes arranged on an insulating panel, and detecting an input operation made near a sensing electrode based on the sensing electrode that increases in stray capacitance in response to an input unit approaching the sensing electrode.

2. Related Art

A capacitive touch panel is known as a pointing device for designating an item such as an icon displayed on a display of an electronic device. The capacitive touch panel detects an input position in a noncontact manner using the change of an electrostatic capacitance caused in response to an input unit such as a finger approaching an entry screen. The capacitive touch panel can detect an input operation even if the capacitive touch panel is placed on the rear side of the display.

A conventional capacitive touch panel includes a large number of X electrodes and a large number of Y electrodes arranged in a matrix on the front and rear sides of an insulating substrate such that the X electrodes and the Y electrodes cross each other. An electrostatic capacitance changes between each of the X electrodes and a Y electrode crossing each other near a position where an input unit such as a finger approached, thereby detecting the position of an operation on the insulating substrate made by the input unit (as disclosed in paragraphs 0017 to 0031 of the specification and FIG. 1 of Japanese Patent Application Publication No. 2005-337773).

Figure 4:
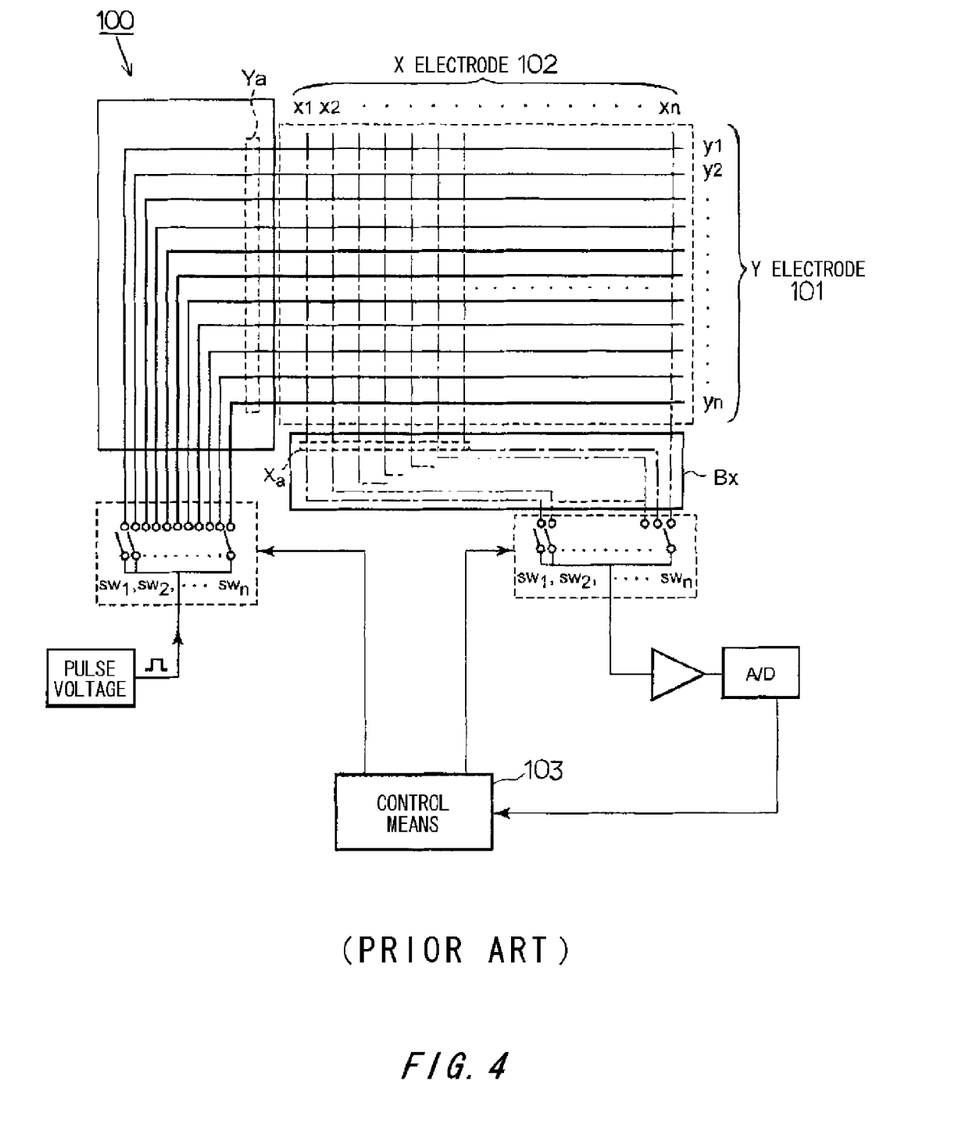
FIG. 4 shows a block diagram showing a conventional capacitive touch panel 100.

In a capacitive touch panel 100 of this type, as shown in FIG. 4, a predetermined pulse voltage is applied sequentially to a large number of Y electrodes 101 to scan the Y electrodes 101. While the pulse voltage is applied to each of the Y electrodes 101, the voltage of an X electrode 102 that crosses the Y electrode 101 having received the pulse voltage is detected. In response to approach of an input unit such as a finger to an insulating substrate, an electrostatic capacitance changes between the X electrode 102 and the Y electrode 101 that cross each other at a position where input unit is approaching. Accordingly, control means 103 detects the position of the operation on the insulating substrate made by the input unit based on the position of the X electrode 102 having changed in voltage as a result of the change of an electrostatic capacitance, and the position of the Y electrode 101 having received the applied pulse voltage at that time.

In the capacitive touch panel 100 disclosed in Japanese Patent Application Publication No. 2005-337773, the large number of X electrodes 102 and Y electrodes 101 must be disposed on the insulating substrate in order to detect an input unit such as a finger based on the change of an electrostatic capacitance. If an entry screen is increased in area, the number of X electrodes and the number of Y electrodes subjected to detection of the change of an electrostatic capacitance are increased in response to the increase of the input area. This results in a longer scanning cycle during which the crossing points of respective electrodes are scanned, making it impossible to detect an input position in a short time.

In addition to the necessity to provide means for applying a pulse voltage, scanning of the large number of X electrodes 102 and Y electrodes 101 arranged in a matrix requires the use of multiplexers in number corresponding to the numbers of the electrodes in response to the increasing size of an entry screen. There is the problem in that the circuit configuration is complicated and increased in size.

Accordingly, a capacitance determining device is suggested (as disclosed in paragraphs 0014 to 0020 of the specification and FIG. 2 of Japanese Patent Application Publication No. 2009-70004) as means for detecting the change of the stray capacitance of a sensing electrode with a simpler circuit configuration. This capacitance determining device detects an unknown electrostatic capacitance at a position of an input operation based on a time constant between the electrostatic capacitance and a known resistance value. In this capacitance determining device, a sensing resistor R is connected in series or in parallel with a capacitor C of an unknown electrostatic capacitance (stray capacitance) to form an RC time constant circuit. A predetermined voltage Vdd is applied to one end of the sensing resistor R, or one end of the sensing resistor R is grounded. The electric potential of the capacitor C that increases or decreases depending on a time constant rc determined by the electrostatic capacitance c of the capacitor C and the resistance value r of the sensing electrode R is compared with a predetermined reference potential. Then, charging times or discharging times until the reference potential is achieved are compared to determine the magnitude of an electrostatic capacitance.

The stray capacitance of a sensing electrode disposed on an insulating panel (electrostatic capacitance between the sensing electrode and the ground) increases to make charging and discharging times longer in response to approach of an input unit such as a finger. Accordingly, based on the aforementioned principles of detection, charging and discharging times until the electric potential of the sensing electrode becomes the same as a predetermined reference potential is measured, and the measured times are compared with charging and discharging times obtained when no input operation is made, so that an input operation approaching the sensing electrode can be detected.

The aforementioned capacitance determining device disclosed in Japanese Patent Application Publication No. 2009-70004 detects an unknown stray capacitance based on a time constant between the stray capacitance and a known resistance value. In this device, charging and discharging times until a reference potential is achieved differ between sensing electrodes. Accordingly, the stray capacitances of all the sensing electrodes cannot be compared simultaneously by a common time measuring circuit composed of a counter for measuring charging and discharging times, a counter-memory, and the like. Thus, a time measuring circuit should be connected to each sensing electrode, or in order to use the common time measuring circuit, charging and discharging times should be made different between the sensing electrodes. This places an obstacle to widespread use of the capacitive touch panel using a time constant of a stray capacitance.

In view of these facts, the applicant of the present application invented the following capacitive touch panel, and filed a patent application assigned as Japanese Patent Application No. 2009-191948. In this capacitive touch panel, binary signals the binary data of which are inverted when the electric potentials of a plurality of sensing electrodes become the same as a reference potential with respect to a common base point in time are given simultaneously as parallel data from the plurality of sensing electrodes to a parallel input register of a bit number corresponding to the number of the plurality of sensing electrodes. The stray capacitances of the plurality of sensing electrodes are compared at the same time based on time until each bit data of the parallel data is inverted.

However, even in the aforementioned capacitive touch panel, the number of sensing electrodes to be subjected to simultaneous detection of the magnitude of a stray capacitance is limited to the number of input bits of the parallel input register. Accordingly, if the capacitive touch panel has more sensing electrodes in number larger than the number of input bits of the parallel input register, in order to detect the stray capacitances of the sensing electrodes, the sensing electrodes should be divided into specific sensing electrode groups such that charging or discharging time does not overlap therebetween.

The capacitive touch panel using a time constant of a stray capacitance makes charge control by applying a predetermined charge voltage Vdd through a resistor to a sensing electrode at a ground potential. The electric potential Vc of the sensing electrode during this charge control is expressed as follows:

$$Vc = Vdd(1 - \epsilon^{-t/cr}) \quad (1)$$

where r is the resistance value of the resistor connected to the sensing electrode, c is a stray capacitance between the sensing electrode and the ground, t is a time elapsed from a base point in time when the charge voltage Vdd is applied, and $\epsilon$ is a natural logarithm. The electric potential Vc of the sensing electrode becomes substantially the same as the charge voltage Vdd after elapse of a transitional period expressed as t=5cr (for the convenience of description, this is called as a state where the electric potential Vc becomes the same as the charge voltage Vdd in the present specification).

Conversely, discharge is controlled by making a sensing electrode at the charge voltage Vdd be at a ground potential through a resistor. The electric potential Vc of the sensing electrode during this discharge control is expressed as follows:

$$Vc = Vdd \times \epsilon^{-t'/cr} \quad (2)$$

where t' is a time elapsed from a base point in time when the charge voltage Vdd is achieved. The electric potential Vc of the sensing electrode becomes substantially the same as the ground voltage after elapse of a transitional period expressed as t'=5cr (for the convenience of description, this is called as a state where the electric potential Vc becomes the same as the ground potential in the present specification).

Suppose a case where a reference potential to be compared with the electric potential Vc of a sensing electrode is near the charge voltage Vdd, and the resolution of a comparison circuit for comparing the reference potential with the electric potential Vc of the sensing electrode is low. In this case, in the former charge control, the elapsed time t is near the transitional period and the electric potential Vc of the sensing electrode increases slightly with respect to the elapsed time t, making it difficult to compare the electric potential Vc with the reference potential. Meanwhile, in the latter discharge control, the electric potential Vc of the sensing electrode drops largely with respect to the elapsed time t, so that the electric potential Vc can be compared more accurately with the reference potential. Conversely, suppose a case where the reference potential is near the ground potential, and the resolution of the comparison circuit for comparing the reference potential with the electric potential Vc of the sensing electrode is low. In this case, in the latter discharge control, the elapsed time t is near the transitional period and the electric potential Vc of the sensing electrode drops slightly with respect to the elapsed time t, making it difficult to compare the electric potential Vc with the reference potential. Meanwhile, in the former charge control, the electric potential Vc of the sensing electrode increases largely with respect to the elapsed time t immediately after start of the charge control, so that the electric potential Vc can be compared more accurately with the reference potential.

The conventional capacitance determining device disclosed in Japanese Patent Application Publication No. 2009-70004 uses only one of the controls for detection. Accordingly, the charge voltage Vdd and the reference potential should be adjusted optimally according to each of the control methods. If they are fixed potentials that cannot be adjusted, there is the problem in that detection accuracy of a stray capacitance may be reduced.

The stray capacitance of a sensing electrode changes under the influence of a peripheral circuit element such as a liquid crystal display element or a peripheral unit. Accordingly, while making comparison between the charge control and the discharge control and selecting the control with a higher degree of detection accuracy have been desired in a stage of product evaluation after assembly, change of the control method has not been allowed.

The present invention has been made in light of the aforementioned conventional problems. It is an object of the invention to provide a capacitive touch panel that compares input operations made to a larger number of sensing electrodes in a short period of time by making two types of sensing electrode groups share a time measuring circuit for simultaneously measuring charging and discharging times that depend on the magnitude of a stray capacitance.

It is also an objet of the invention to provide a capacitive touch panel capable of selecting a method of controlling a voltage with a higher degree of detection accuracy according to a charge voltage Vdd and a reference potential to be compared with the electric potential Vc of a sensing electrode.

It is also an object of the invention to provide a capacitive touch panel capable of selecting a method of controlling a voltage with a higher degree of detection accuracy according to an operating environment.

SUMMARY

In order to achieve the aforementioned objects, a capacitive touch panel as recited in claim 1 includes: a plurality of sensing electrodes arranged on an insulating panel while being insulated from each other; a plurality of capacitance-time conversion means having the same structure connected to the respective sensing electrodes, the capacitance-time conversion means each outputting a binary signal, the binary signal having binary data that is inverted in varying time with respect to a predetermined base point in time depending on a magnitude of a stray capacitance of a corresponding sensing electrode; and input operation detecting means for detecting a sensing electrode an input unit is approaching by comparing the magnitudes of the stray capacitances of the sensing electrodes based on times for the binary data to be inverted with respect to the base point in time of the binary signals. The capacitance-time conversion means includes: a resistor connected in series or in parallel with the stray capacitance of a sensing electrode; a charge and discharge circuit that can select either charge control or discharge control and control, the charge control being such that a stray capacitance is charged or discharged from the base point in time to raise an electric potential of a sensing electrode from a ground potential to a predetermined charge potential with a time constant determined by a resistance value of the resistor and the stray capacitance of the sensing electrode, the discharge control being such that the electric potential of the sensing electrode is reduced from the charge potential to the ground potential; and a comparison circuit for comparing the electric potential of the sensing electrode with respect to the base point in time with a reference potential set between the charge potential and the ground potential, and outputting a binary signal binary data of which is inverted when a difference between the electric potential of the sensing electrode and the reference potential is inverted. In this configuration, the charge and discharge circuits of the specific capacitance-time conversion means connected to respective ones of at least two or more specific sensing electrodes raise or reduce the electric potentials of the specific sensing electrodes with respect to the base point in time under the same charge control or the same discharge control. Further, the input operation detecting means detects any of the specific sensing electrodes the input unit is approaching based on times for the binary data of binary signals output from the comparison circuits of the specific capacitance-time conversion means to be inverted with respect to the base point in time.

The stray capacitance of a sensing electrode the input unit has approached in response to an input operation increases, and the time constant determined by the resistance value of a resistor connected to the sensing electrode increases. Accordingly, the electric potential of the sensing electrode becomes the same as the reference potential regardless of whether the sensing electrode is subjected to the charge control or the discharge control. Further, time until the binary data of its binary signal is inverted is longer than that of a binary signal output from the capacitance-time conversion circuit of a different sensing electrode. The input operation detecting means compares times for the binary data to be inverted to detect a specific sensing electrode which the input unit has approached and which is subjected to the same charge control or the same discharge control.

The specific sensing electrodes in an arbitrary number can be selectively controlled either by the charge control or by the discharge control of a sensing electrode. A specific sensing electrode the input unit is approaching can be detected from these specific sensing electrodes.

In the capacitive touch panel as recited in claim 2, the plurality of sensing electrodes arranged on the insulating panel are divided into first specific sensing electrodes and second specific sensing electrodes. The respective charge and discharge circuits of first specific capacitance-time conversion means connected to respective ones of the first specific sensing electrodes perform the charge control to raise the electric potentials of the first specific sensing electrodes that are at the ground potential at a first base point in time. The respective charge and discharge circuits of second specific capacitance-time conversion means connected to respective ones of the second specific sensing electrodes perform the discharge control to reduce the electric potentials of the second specific sensing electrodes that are at the charge potential at a second base point in time. The input operation detecting means detects any of the first specific sensing electrodes the input unit is approaching based on time for binary data of a binary signal to be inverted with respect to the first base point in time. The input operation detecting means detects any of the second specific sensing electrodes the input unit is approaching based on time for binary data of a binary signal to be inverted with respect to the second base point in time.

A specific sensing electrode of the first specific sensing electrodes the input unit approached and a specific sensing electrode of the second specific sensing electrodes the input unit approached are detected while the first specific sensing electrodes are subjected to the charge control and the second specific sensing electrodes are subjected to the discharge control. This allows a specific sensing electrode the input unit is approaching to be detected that belongs to each of the two types of specific sensing electrodes within one cycle during which all the plurality of sensing electrodes are subjected to the charge and discharge controls.

The capacitive touch panel as recited in claims 3 and 5 includes a changeover switch for selectively connecting a common input of the input operation detecting means either to each output of the first specific capacitance-time conversion means, or to each output of the second specific capacitance-time conversion means. The changeover switch connects the common input of the input operation detecting means to the each output of the first specific capacitance-time conversion means when each of the charge and discharge circuits of the first specific capacitance-time conversion means performs the charge control while the changeover switch connects the common input of the input operation detecting means to the each output of the second specific capacitance-time conversion means when each of the charge and discharge circuits of the second specific capacitance-time conversion means perform the discharge control.

Binary signals used to detect the first and second specific sensing electrodes the input unit is approaching are output from the specific capacitance-time conversion means in a period during which the first and second specific sensing electrodes are subjected to different ones of the charge and discharge controls. The changeover switch connects the common input of the input operation detecting means to the specific capacitance-time conversion means that output a binary signal used to detect a specific sensing electrode. Thus, the common input of the input operation detecting means can be used for detection of both of the two types of first and second specific sensing electrodes.

In the capacitive touch panel as recited in claim 4, the first specific sensing electrodes are a plurality of sensing electrodes arranged in one direction of the insulating panel, and the second specific sensing electrodes are a plurality of sensing electrodes arranged in a direction of the insulating panel perpendicular to the one direction.

A sensing electrode the input unit is approaching can be detected in each of the directions of the insulating panel perpendicular to each other and in one cycle of the charge and discharge controls.

In the capacitive touch panel as recited in claim 6, the input operation detecting means determines a position of a specific sensing electrode having a highest stray capacitance among the specific sensing electrodes as an input position at which an input operation was made.

Since the stray capacitance of a sensing electrode nearest the input unit to make an input operation increases compared to the stray capacitances of other sensing electrodes, the position of the sensing electrode having the highest stray capacitance can be determined as an input position.

According to the invention as recited in claim 1, a method of controlling a voltage with a higher degree of detection accuracy can be selected according to a charge voltage Vdd or a reference potential to be compared with the electric potential Vc of a sensing electrode, or according to operating environment.

According to the invention as recited in claim 2, a specific sensing electrode the input unit is approaching that belongs to each of the two types of specific sensing electrodes can be detected within one cycle during which the electric potentials of the sensing electrodes are subjected to the charge and discharge controls.

According to the invention as recited in claims 3 and 5, a sensing electrode the input unit is approaching can be detected in a short time among a large number of sensing electrodes by using the input operation detecting means of a limited number of input bits.

According to the invention as recited in claim 4, a specific sensing electrode the input unit is approaching can be detected in each of the directions perpendicular to each other on the insulating panel and in one cycle of the charge and discharge controls, so that an input position in two dimensions can be detected in a short time.

According to the invention as recited in claim 6, the stray capacitance of a sensing electrode nearest the input unit becomes the highest of other stray capacitances by only making the input unit approach the insulating panel and without making contact between the sensing electrode and the input unit such as a finger. This allows input of an input position in a noncontact manner while referring to a display on a display element stacked on the insulating panel.

DESCRIPTION OF EXEMPLARY EMBODIMENTS

A capacitive touch panel (hereinafter called a touch panel) 1 according to an embodiment of the present invention will be described below with reference to FIGS. 1 to 3. In the touch panel 1, a plurality of X sensing electrodes $3x_1$, $3x_2$, $3x_3$ and $3x_4$ are formed on an insulating panel not shown, and arranged in an X direction with an insulation distance of some millimeters therebetween, for example, and a plurality of Y sensing electrodes $3y_1$, $3y_2$, $3y_3$ and $3y_4$ are arranged in a Y direction perpendicular to the X direction with the same insulation distance of some millimeters therebetween. The numbers of X and Y sensing electrodes $3x$ and $3y$ arranged on the insulating panel have an upper limit that is the number of sensing electrodes which an input unit is approaching and which can be detected in the same charge and discharge controls described later, namely the number of input bits of a first register 6 described later. If their outputs are to be divided by different charge or discharge cycles, the upper limit of the numbers of X and Y sensing electrodes $3x$ and $3y$ can be an integral multiple of this number of input bits. Here, for the convenience of description, the assumed number of input bits of the first register 6 is four, and the assumed numbers of X and Y sensing electrodes $3x$ and $3y$ are each four.

The respective stray capacitances Csx and Csy of the sensing electrodes $3x$ and $3y$ are each expressed as a total of the capacitance of a surrounding conductive pattern, capacitance of a shield case to shield a unit, and capacitance formed between the sensing electrode and the ground. The stray capacitances Csx and Csy increase in response to approach of an input unit such as a finger as a result of an input operation made by an operator while other capacitances are kept at substantially the constant levels. The stray capacitances Csx and Csy of the sensing electrodes 3 are compared, and are also compared with the stray capacitances of different sensing electrodes $3x$ and $3y$. Sensing electrodes $3x$ and $3y$ having the highest stray capacitances Csx and Csy are regarded as those an input unit having made an input operation approached, thereby detecting the sensing electrodes $3x$ and $3y$ the input unit have approached.

For comparison of the stray capacitances Csx and Csy of the sensing electrodes $3x$ and $3y$, capacitance-time conversion circuits 2 for outputting the stray capacitances Csx and Csy expressed as time intervals of binary signals are connected to the corresponding sensing electrodes $3x$ and $3y$.

The capacitance-time conversion circuits 2 each include: a charge and discharge switch 4 for switching a common terminal between a reference charge voltage Vdd and a ground potential GND; a sensing resistor R1 connected in series between the common terminal of the charge and discharge switch 4 and the sensing electrode 3, the sensing resistor R1 forming a time constant circuit together with a capacitor of the stray capacitance Csx or Cxy of the sensing electrode $3x$ or $3y$ (for the convenience of description, the capacitor of the stray capacitance Csx or Csy is called stray capacitance Csx or Csy); a resistor R2 of the sensing electrode $3x$ or $3y$; and a comparator 5 having a non-inverting input connected to the sensing electrode $3x$ or $3y$ with an inverting input being at a reference potential $V_{sh}$. The reference potential $V_{sh}$ is a predetermined electric potential between the reference charge voltage Vdd and the ground potential GND, and here, is set to 50% of the electric potential of Vdd. Accordingly, when the charge and discharge switch 4 is switched from the ground potential GND to the reference charge voltage Vdd, the stray capacitance Csx or Csy is charged at a time constant determined by the resistance values of the sensing resistors R1 and R2, and the stray capacitance Csx or Csy. The output Cx or Cy of the comparator 5 is inverted if the electric potential of the sensing electrode $3x$ or $3y$ increases from the ground potential GND to a level higher than the reference potential $V_{sh}$.

The resistance values of the sensing resistors R1 and R2, the circuit constant of the comparator 5 and the like, and the level of the reference potential $V_{sh}$ are the same in all the capacitance-time conversion circuits 2. Switching controls of the charge and discharge switches 4 are performed at the same time by a switching control signal a given from a microcomputer 20 shown in FIG. 2 such that the reference charge voltage Vdd is applied to the common terminals simultaneously at a first base point in time t0, and that the common terminals become the ground potential GND simultaneously at a second base point in time tg. Thus, the electric potential of the sensing electrode 3 during charge control for charging the aforementioned stray capacitance Csx or Csy at the ground potential GND with the reference charge voltage Vdd increases at a rate that is determined by a time constant obtained by multiplying the resistance values of the sensing resistors R1 and R2 by the stray capacitance Csx or Csy. This rate entirely depends on the stray capacitance Csx or Csy. The voltage increases slowly with increase of the stray capacitance Csx or Csy, leading to lengthen the time from the first base point in time t0 until the output c of the comparator 5 is inverted. Likewise, the electric potential of the sensing electrode 3 during discharge control for discharging the stray capacitance Csx or Csy at the reference charge voltage Vdd to the ground potential GND decreases at a rate that depends on the sensing resistor R1, and also entirely depends on the stray capacitance Csx or Csy. The voltage decreases slowly with increase of the stray capacitance Csx or Csy, leading to lengthen the time from the second base point in time Tg until the output c of the comparator 5 is inverted. The stray capacitance Csx or Csy of the sensing electrode 3 is generally about 10 pF, and the amount of change of the stray capacitance Csx or Csy to occur in response to approach of an input unit such as a finger is generally from about 1 to about 3 pF. Since this change is determined based on time for the output c to be inverted, the resistance values of the sensing resistors R1 and R2 are each set to 10 MΩ.

Figure 1:
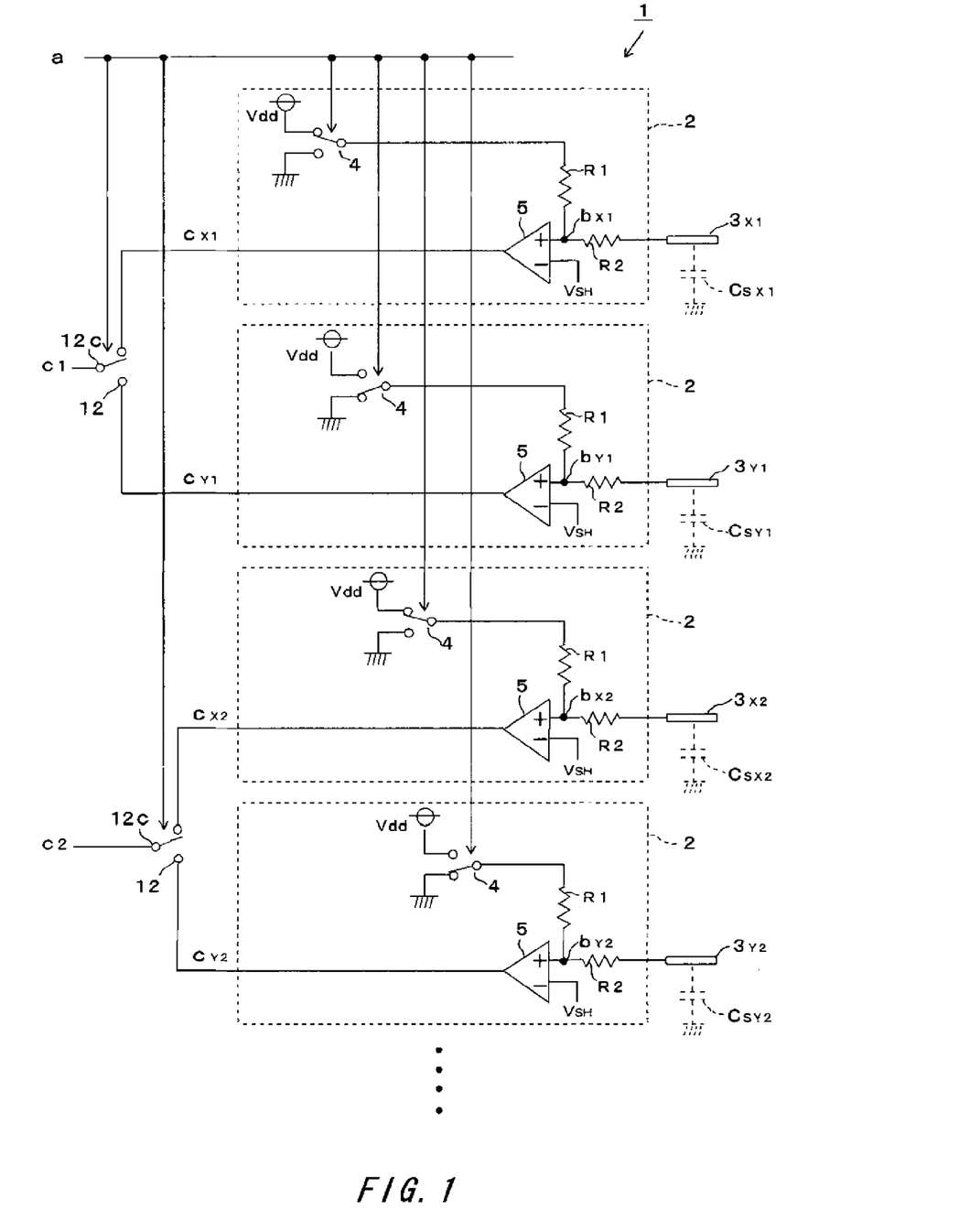
FIG. 1 shows a circuit diagram showing a plurality of sensing electrodes 3 and capacitance-time conversion circuits 2 of a capacitive touch panel 1 according to an embodiment of the present invention.

As shown in FIG. 1, regarding the outputs Cx1, Cx2 and others and the outputs Cy1, Cy2 and others of the comparators 5 of the capacitance-time conversion circuits 2, the paired outputs Cx1 and Cy1, paired outputs Cx2 and Cy2, and other paired outputs of the corresponding sensing electrodes 3x and 3y in a pair are connected to switching terminals of changeover switches 12, respectively. Switching controls of the changeover switches 12 are also performed at the same time by the switching control signal a given from the microcomputer 20. A common terminal 12c is connected to the output Cx of the sensing electrode 3x during the charge control, and is connected to the output Cy of the sensing electrode 3y during the discharge control.

The common terminal 12c of each of the changeover switches 12 is connected to each input of the first register (T) 6 that is a four-bit PIPO (parallel input parallel output) register. One outputs as c1, c2, and others of the either side selectively connected by the changeover switches 12 are given in parallel as four-bit parallel data to the first register (T) 6.

Each bit data of the parallel data corresponds to the value of a binary signal of each of the outputs c1, c2, c3 and c4, and is stored as "1" if the output is "H," and is stored as "0" if the output is "L." Parallel outputs from the first register (T) 6 are connected to parallel inputs of a second register (T-1) 7 that is also a four-bit PIPO register. The first register (T) 6 and the second register (T-1) 7 are connected to the common shift clock terminal (SFT) and the common reset output terminal (RESET) of the microcomputer 20. The first register (T) 6 and the second register (T-1) 7 make the inputs and outputs of four-bit register values stored therein each time they receive a shift clock from the clock terminal (SFT). The first register (T) 6 and the second register (T-1) 7 reset four-bit register values stored therein each time they receive a reset signal from the reset output terminal (RESET). To be specific, the first register (T) 6 holds the binary data of the respective outputs c1, c2, c3 and c4 stored as a four-bit register value when a shift clock is input until a next shift clock is received. Likewise, the second register (T-1) 7 holds the four-bit register value output from the first register (T6) until a next shift clock is received. When a trigger signal is input from a register value comparison circuit 8 described later, the first register (T) 6 enters a register value stored at that time into a RAM 10.

Each time a new four-bit register value of the outputs c1, c2, c3 and c4 is stored in the first register (T) 6, the register value comparison circuit 8 compares this register value and a register value stored in the second register (T-1) 7. The register value comparison circuit 8 outputs a trigger signal to the first register (T) 6 and a counter 11 described later if bit data of at least one of the four bits differs therebetween. Since the register value stored in the second register (T-1) 7 is a register value that has been stored in the first register (T) 6 immediately before the latest shift clock is input, a trigger signal is output if binary data of at least one of the outputs c1, c2, c3 and c4 changes.

The microcomputer 20 receives a clock signal from a clock issuing circuit. Here, the microcomputer 20 controls the operations of the registers 6 and 7 with the aforementioned shift clock at a frequency given by dividing the frequency of a clock signal, which is 50 MHz in this embodiment. The microcomputer 20 also outputs the switching control signal a at a timing described later to each of the charge and discharge switches 4 and each of the changeover switches 12 to control the switchings thereof. A difference in time until the binary data of the outputs c is inverted by an input operation is about 10 to 30 μsec. Accordingly, the shift clock is set to have a frequency of at least 1 MHz or higher in order to reliably detect such a difference in time.

The microcomputer 20 performs the following detection. The microcomputer 20 detects each of the sensing electrodes 3x and 3y in the X and Y directions perpendicular to each other to find sensing electrodes 3 an input unit is approaching based on a combination of a count value and a register value stored in association with each other in the RAM 10 for each detection cycle Tp shown in FIG. 3. Then, the microcomputer 20 outputs an input position in two dimensions based on the positions of these sensing electrodes 3x and 3y in the X and Y directions.

The counter 11 counts up the count value with a frequency given by dividing the frequency of the clock signal output from the clock oscillating circuit 9. The counter value of the counter 11 is reset with the reset signal output from the microcomputer 20 at the first base point in time t0. When a trigger signal is received from the register value comparison circuit 8, the count value at that time is output to the RAM 10 as shown in FIG. 2.

Figure 2:
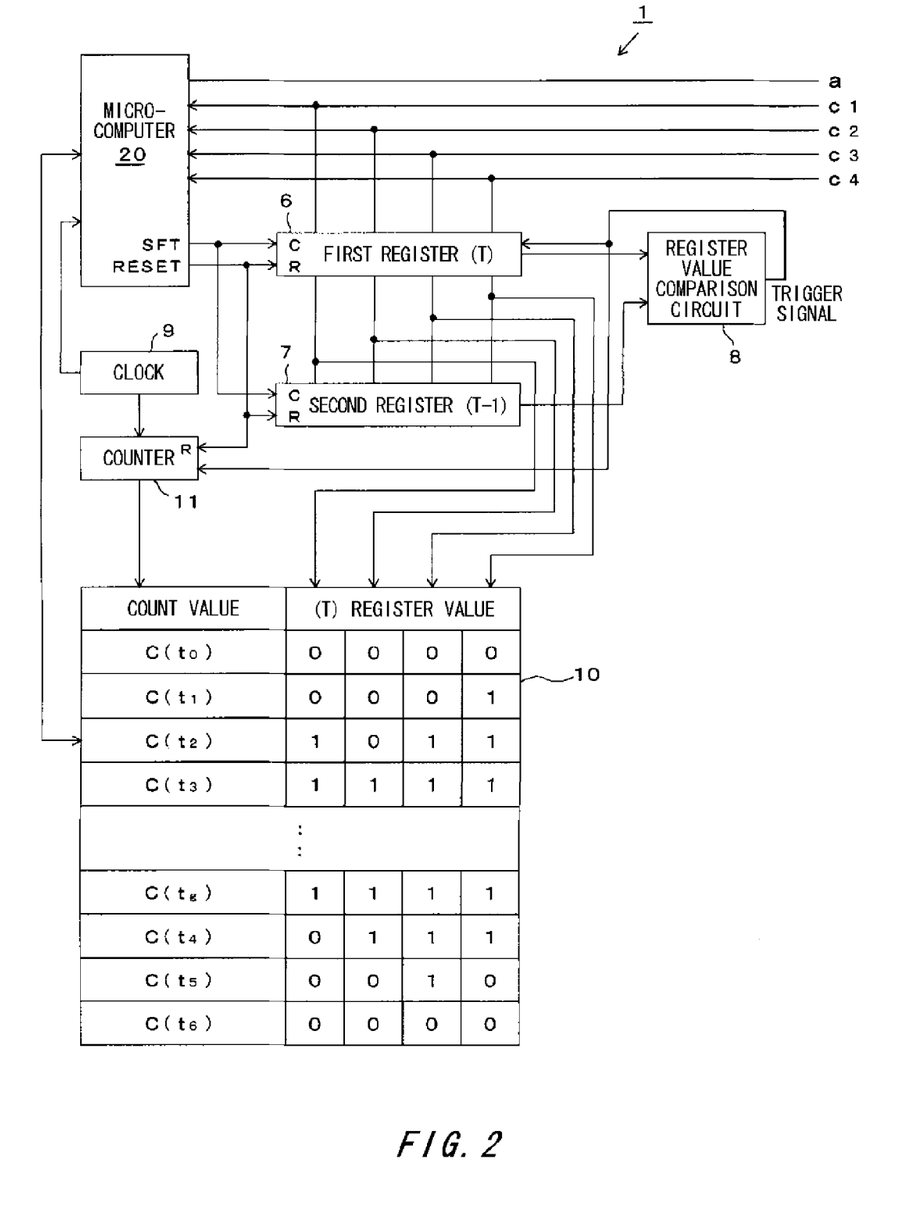
FIG. 2 shows a block diagram of an input position detecting circuit (input operation detecting means) of the capacitive touch panel 1.
Figure 3:
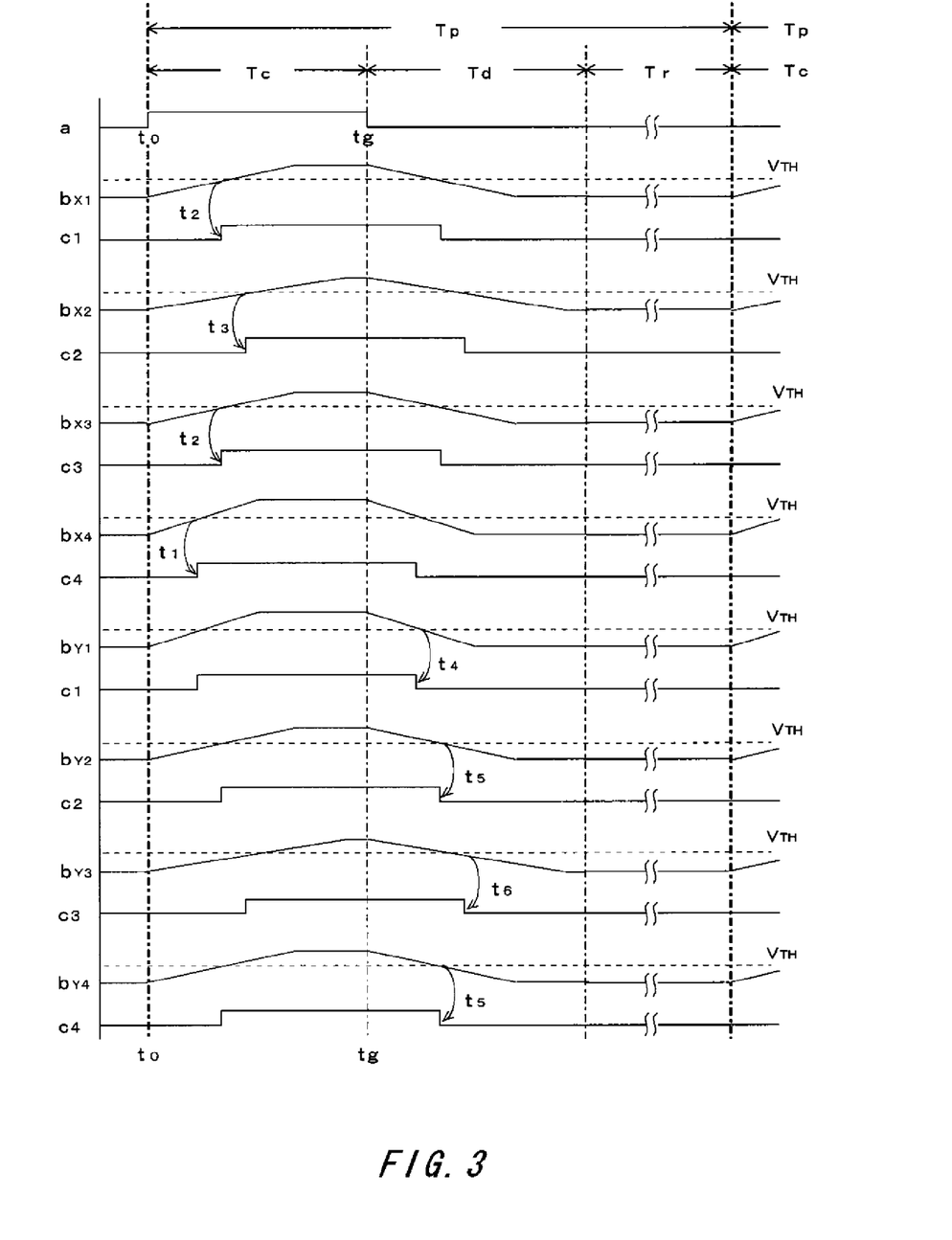
FIG. 3 shows a waveform chart showing each waveform of a, b, and c of FIG. 1.

As shown in FIG. 2, each time the register value comparison circuit 8 outputs a trigger signal, a count value of the counter 11 at that time and a register value stored in the first register (T) 6 at that time are stored in association with each other into the RAM 10 as a temporary storage device. The RAM 10 holds each combination associated with a count value until a register value the bit data thereof are all "0" is entered. The data about each combination stored in the RAM 10 is cleared in each detection cycle Tp under control of the microcomputer 20 before the base point in time t0 of a next cycle comes.

An operation to detect an input operation by the touch panel 1 with the aforementioned structure will be described next. The microcomputer 20 repeats detection of an input operation in an operating mode for detecting an input operation in the detection cycle Tp, as shown in FIG. 3, with the detection cycle Tp including rest time Tr in addition to charging time Tc in which the stray capacitance Csx or Csy of the sensing electrode 3x or 3y is charged, and discharging time Td in which the stray capacitance Csx or Csy is discharged. The charging time Tc is the time between the first base point in time t0 when the charge and discharge switches 4 are switched to the charge voltage Vdd and the second base point in time tg when the charge and discharge switches 4 are switched to the ground potential GND. The charging time Tc is set as elapsed time sufficient for the electric potentials of all the sensing electrodes 3 at the ground potential GND to become the charge voltage Vdd regardless of the presence or absence of an input operation. The highest value of the stray capacitance Cs is about 10 pF, and the stray capacitance Csx or Csy is charged through the series-connected sensing resistors R1 and R2 at 10 MΩ in the present embodiment. A transitional period until the electric potentials of the sensing electrodes 3 become substantially the same as the charge voltage Vdd is 500 μsec, and accordingly, the charging time Tc until the second base point in time tg is set at 500 μsec.

The discharging time Tg is also set as elapsed time sufficient for the electric potentials of all the sensing electrodes 3 at the charge voltage Vdd to decrease to the ground potential GND regardless of the presence or absence of an input operation, and is set at the same 500 μsec as the charging time Tc. In order to shorten time to detect an input operation, time when the discharging time Td has elapsed may be set as the first base point in time t0 of a next cycle, so that the rest time Tr will not be provided in the detection cycle Tp. However, the present embodiment provides the rest time Tr of 1 msec to set the detection cycle Tp at 2 msec. The microcomputer 20 performs the detection during the discharging time Td and the rest time Tr by calculating an input position based on data stored in the RAM 10.

According to the present embodiment as described above, the stray capacitances Cs of the many capacitance-time conversion circuits 2 are charged or discharged simultaneously. This eliminates the need to control charge and discharge such that the capacitance-time conversion circuits 2a are charged or discharged in different periods. Accordingly, an input operation can be detected in the short detection cycle Tp even with the sufficiently long rest time Tr provided. This results in low power consumption even when the microcomputer 20 is operated in the operating mode for detecting an input operation. Accordingly, if used in an input unit of a portable device such as a remote-controlled transmitter-receiver or a cell phone that cannot receive power from outside, the device can be used for a long time without exchange of a battery.

The microcomputer 20 outputs the reset signal from the reset output terminal (RESET) at the first base point in time t0, thereby resetting register values in the first register (T) 6 and the second register (T-1) 7, and the count value of the counter 11 while clearing data stored in the RAM 10. Here, the reset register values in the first register (T) 6 and the second register (T-1) 7 are made "0" in order to store the register value of the first register (T) 6 at the first base point in time t0 in the RAM 10. Meanwhile, the register value of each of the first register (T) 6 and the second register (T-1) is "0" at a time when the detection cycle Tp ends, so that the register values are not necessarily required to be reset.

The microcomputer 20 performs switching control by outputting the switching control signal a to the changeover switches 12 and to the charge and discharge switches 4 of the capacitance-time conversion circuits 2 at the first point in time t0 simultaneously. Outputting the switching control signal a for switching from "L" to "H" at the first base point in time t0 causes the capacitance-time conversion circuits 2 to be in a charge control mode. Then, the changeover switches 12 provide the outputs Cx of the sensing electrodes 3x in parallel as the outputs c1, c2 and others to the first register 6. The sensing electrodes 3x and 3y are each switched from the ground potential GND to the charge voltage Vdd so that the stray capacitances Csx and Csy of the sensing electrodes 3x and 3y are charged with the charge voltage Vdd. The electric potentials of the sensing electrodes 3x and 3y wherein the corresponding charge and discharge switches 4 have been switched to the ground potential GND until the first base point in time t0 are at the ground potential GND that does not exceed the reference potential $V_{sh}$. Thus, the outputs cx1, cx2, cx3 and cx4 of the respective comparators 5 are all "L" at the base point in time t0, and accordingly, four-bit parallel data "0000" is stored in the first register (T) 6.

The register value comparison circuit 8 outputs a trigger signal to the counter 11 and the first register (T) 6 at the first base point in time t0 that is reset time. The RAM 10 stores a count value C (t0) indicating the first base point in time t0, and a register value "0000" stored in the first register (T) 6 at the first base point in time t0 in association with each other as shown in FIG. 2.

This charge control increases the electric potential Vc of each of the sensing electrodes 3x and 3y at the ground potential GND in accordance with the formula represented by:

$$Vc = Vdd(1 - \epsilon^{-t/cr}) \quad (1)$$

where r is a sum of the resistance values of the series-connected resistors R1 and R2 of each of the sensing electrodes 3x and 3y, c is a stray capacitance between the sensing electrode and the ground, t is time elapsed from a base point in time when the charge voltage Vdd is applied, and ε is a natural logarithm. The electric potential Vc increases rapidly as the stray capacitance c becomes smaller.

It is assumed that an input unit such as a finger to make an input operation approaches the position of the sensing electrode 3x2 in the X direction. In this case, the stray capacitance Csx4 of the sensing electrode 3x4 far from the input unit and which is not influenced by the input unit becomes the lowest capacitance. Accordingly, the electric potential bx4 of the sensing electrode 3x4 that increases with a time constant of a resistance value that is common among the sensing electrodes 3x exceeds the reference potential $V_{sh}$ at the earliest time t1 as shown in FIG. 3. Then, the output c4 of the comparator 5 is inverted from "L" to "H," and parallel data "0001" the lowest-order bit of which becomes "1" is stored in the first register (T) 6. Since this register value differs from the register value "0000" stored in the second register (T-1) 7, the register value comparison circuit 8 outputs a trigger signal to the counter 11 and the first register (T) 6. In response, a count value C (t1) indicating the time t1 and the register value "0001" newly stored in the first register (T) 6 are stored in association with each other in the RAM 10.

Referring next to the sensing electrodes 3x1 and 3x3 which are arranged on opposite sides of the sensing electrode 3x2 and spaced by the substantially same distance from the input unit approaching the sensing electrode 3x2, the stray capacitances Csx1 and Csx3 thereof are higher than the stray capacitance Csx4. When the electric potentials bx1 and bx3 of the sensing electrodes 3x1 and 3x3 exceed the reference potential $V_{sh}$ at a time t2, the outputs c1 and c3 of the comparators 5 are inverted from "L" to "H." Then, parallel data "1011" is given to the first register (T) 6. Since the first and third bits of this register value differ from those of the register value "0001" stored in the second register (T-1) 7, the register value comparison circuit 8 outputs a trigger signal to the counter 11 and the first register (T) 6. Then, the register value "1011" newly stored in the first register (T) 6 is stored in association with a count value C (t2) indicating the time t2 in the RAM 10.

The stray capacitance Csx2 of the sensing electrode 3x2 nearest the input position is the highest among all the stray capacitances. Accordingly, the electric potential bx2 of the sensing electrode 3x2 exceeds the reference potential $V_{sh}$ at the latest time t3 as shown in FIG. 3, and the output c2 of the corresponding comparator 5 is inverted from "L" to "H." As a result, parallel data "1111" is stored in the first register (T) 6 at the time t3. Since this register value differs from the register value "1011" stored in the second register (T-1) 7, the register value comparison circuit 8 outputs a trigger signal to the counter 11 and the first register (T) 6. Then, a count value C (t3) indicating the time $t_3$, and the register value "1111" stored in the first register (T) 6 are stored in association with each other in the RAM 10 as shown in FIG. 2.

The microcomputer 20 changes the output of the switching control signal a from "H" to "L" at the second base point in time tg after elapse of the charging time Tc from the first base point in time t0. Then, the microcomputer 20 switches the charge and discharge switches 4 from the charge voltage Vdd to the ground potential GND, emits electric charges in the discharging time Td that are stored in each stray capacitance Cs, and shifts the capacitance-time conversion circuits 2 to a discharge control mode to make the electric potentials of all the sensing electrodes 3 be the ground potential GND. The changeover switches 12 receive the switching control signal a indicating the switching from "H" to "L" to provide the outputs Cy of the sensing electrodes 3y in parallel as the outputs c1, c2 and others to the first register 6.

The electric potentials of all the sensing electrodes 3x and 3y are higher than the reference potential $V_{sh}$ at the second base point in time tg after elapse of 500 µsec corresponding to the transitional period from the first base point in time tO. Accordingly, the register value "1111" stored in the first register (T) 6 will not change even if the outputs Cy of the sensing electrodes 3y are output to the first register (T) 6. However, the register value comparison circuit 8 still outputs a trigger signal to the counter 11 and the first register (T) 6 at the second base point in time tg. Then, a count value C (tg) indicating the second base point in time tg and the register value "1111" stored in the first register (T) at the second base point in time tg are stored in association with each other in the RAM 10 as shown in FIG. 2.

The electric potential Vc of a sensing electrode during the discharge control that makes each of the sensing electrodes 3x and 3y be at the charge voltage Vdd be the ground potential through the resistors R1 and R2 is expressed by:

$$Vc = Vdd \times \epsilon^{-t'/cr} \quad (2)$$

where t' is the time elapsed from the second base point in time tg when the charge voltage Vdd is achieved, and the electric potential Vc decreases rapidly as the stray capacitance c becomes smaller.

Suppose that an input unit such as a finger to make an input operation approaches the position of the sensing electrode 3y3 in the Y direction. In this case, the stray capacitance Csy1 of the sensing electrode 3y1 which is far from the input unit and not influenced by the input unit becomes the lowest capacitance. Accordingly, the electric potential by1 of the sensing electrode 3y1 that decreases with a time constant of a resistance value that is common among the sensing electrodes 3y becomes lower than the reference potential $V_{sh}$ at the earliest time t4 as shown in FIG. 3. Then, the output cl of the comparator 5 is inverted from "H" to "L," and parallel data "0111" the highest-order bit of which is "0" is stored in the first register (T) 6. Since this register value differs from the register value "1111" stored in the second register (T-1) 7, the register value comparison circuit 8 outputs a trigger signal to the counter 11 and the first register (T) 6. Then, a count value C (t4) indicating the time t4 and the register value "0111" newly stored in the first register (T) 6 are stored in association with each other in the RAM 10.

Referring next to the sensing electrodes 3y2 and 3y4 which are arranged on opposite sides of the sensing electrode 3y3 and spaced by the substantially same distance from the input unit approaching the sensing electrode 3y3, the stray capacitances Csy2 and Csy4 thereof are higher than the stray capacitance Csy1. When the electric potentials by2 and by4 of the sensing electrodes 3y2 and 3y4 become smaller than the reference potential $V_{sh}$ at a time t5, the outputs c2 and c4 of the comparators 5 are inverted from "H" to "L," and parallel data "0010" is stored in the first register (T) 6. Since the second and fourth bits of this register value differ from those of the register value "0111" stored in the second register (T-1) 7, the register value comparison circuit 8 outputs a trigger signal to the counter 11 and the first register (T) 6. Then, the register value "0010" newly stored in the first register (T) 6 is stored in association with a count value C (t5) indicating the time t5 in the RAM 10.

The stray capacitance Csy3 of the sensing electrode 3y3 nearest the input position is the highest among all the stray capacitances. Accordingly, the electric potential by3 of the sensing electrode 3y3 becomes lower than the reference potential $V_{sh}$ at the latest time t6 as shown in FIG. 3. Then, the output c3 of the corresponding comparator 5 is inverted from "H" to "L." As a result, parallel data "0000" is stored in the first register (T) 6 at the time t6. Since this register value differs from the register value "0010" stored in the second register (T-1) 7, the register value comparison circuit 8 outputs a trigger signal to the counter 11 and the first register (T) 6. Then, a count value C (t6) indicating the time t6 and the register value "0000" stored in the first register (T) 6 are stored in association with each other in the RAM 10 as shown in FIG. 2.

The electric potentials of all the sensing electrodes 3x and 3y are lower than the reference potential $V_{sh}$ at a time after elapse of 500 µsec corresponding to the transitional period from the second base point in time tg. The register value "0000" stored in the first register (T) 6 does not change during the rest time Tr before the first base point in time t0 of a next cycle Tp comes. The microcomputer 20 reads a combination of each count value C (t) and a register value stored in the RAM 10 during the rest time Tr. The count value C (t) indicates elapsed time from the base point in time t0 when charge is started. A register value indicates bits the bit data of which differs from that of a register value in a preceding combination. The bits of each register value correspond to the stray capacitances Csx and Csy of the sensing electrodes 3x and 3y, and elapsed time from the first or second base point in time t0 or tg is made longer by the magnitude of the stray capacitance Csx or Csy. Accordingly, the microcomputer 20 can separately compare the magnitudes of the stray capacitances Csx of the X sensing electrodes 3x, and the magnitudes of the stray capacitances Csy of the Y sensing electrodes 3y by referring to the data of each combination stored in the RAM 10.

As shown in FIG. 2, regarding the X sensing electrodes 3x, four-bit data changes in the fourth bit (LSB), in the first bit (MSB) and in the third bit, and in the second bit in this order. Accordingly, the stray capacitance Csx is found to increase from Csx4, Csx1 and Csx3, and Csx2 in this order. This allows the microcomputer 20 to determine that an input unit has approached the sensing electrode 3x2 in the X direction with the highest stray capacitance Csx, and the position of the sensing electrode 3x2 is defined as an input position in the X direction.

Regarding the Y sensing electrodes 3y, four-bit data changes in the first bit (MSB), in the second bit and in the fourth bit (LSB), and in the third bit in this order. Accordingly, the stray capacitance Csy is found to increase from Csy1, Csy2 and Csy4, and Csy3 in this order. This allows the microcomputer 20 to determine that the input unit has approached the sensing electrode 3y3 in the Y direction with the highest stray capacitance Csy, and the position of the sensing electrode 3y3 is defined as an input position in the Y direction. As a result, the microcomputer 20 outputs the positions of the sensing electrodes 3x2 and 3y3 as an input position in two dimensions to an external control circuit for controlling cursor movement on a display screen not shown or controlling the operation of an electronic device, and makes the external control circuit perform predetermined processing according to the input position.

After detecting the input position during the rest time Tr, the microcomputer 20 clears data stored in the RAM 10 before the first base point in time t0 of a next cycle Tp comes.

An input position may also be detected as follows. The magnitudes of the stray capacitances Csx and Csy of a plurality of sensing electrodes 3x and 3y are compared. Then, positions in the X and Y directions between the positions of the sensing electrodes 3x and 3y, determined by a ratio obtained by proportionally dividing the plurality of stray capacitances Csx and Csy, are defined as an input position.

In the embodiment as described above, a plurality of sensing electrodes arranged on an insulating panel are divided into the X sensing electrodes 3x and the Y sensing electrodes 3y, and the sensing electrodes of one side are subjected to the charge control while the sensing electrodes of the other side are subjected to the discharge control, thereby detecting a sensing electrode an input unit is approaching. Meanwhile, all sensing electrodes can be controlled equally by the charge control or the discharge control, and either one of the controls optimum for detection may be selected in light of operating environment, the charge voltage Vdd, the reference potential $V_{sh}$, and the like.

The present invention is suitably applied to a capacitive touch panel with a display placed on an input screen, which detects a noncontact input operation.

What is claimed is:

1. A capacitive touch panel, comprising:
    a plurality of sensing electrodes arranged on an insulating panel while being insulated from each other;
    a plurality of capacitance-time conversion means having the same structure connected to the respective sensing electrodes, the capacitance-time conversion means each outputting a binary signal, the binary signal having binary data that is inverted in varying time with respect to a predetermined base point in time depending on a magnitude of a stray capacitance of a corresponding sensing electrode; and
    input operation detecting means for detecting a sensing electrode an input unit is approaching by comparing the magnitudes of the stray capacitances of the sensing electrodes based on times for the binary data to be inverted with respect to the base point in time of the binary signals,
    wherein the capacitance-time conversion means includes:
        a resistor connected in series or in parallel with the stray capacitance of a sensing electrode;
        a charge and discharge circuit that can select either charge control or discharge control and control, the charge control being such that a stray capacitance is charged or discharged from the base point in time to raise an electric potential of a sensing electrode from a ground potential to a predetermined charge potential with a time constant determined by a resistance value of the resistor and the stray capacitance of the sensing electrode, the discharge control being such that the electric potential of the sensing electrode is reduced from the charge potential to the ground potential; and
        a comparison circuit for comparing the electric potential of the sensing electrode with respect to the base point in time with a reference potential set between the charge potential and the ground potential, and outputting a binary signal binary data of which is inverted when a difference between the electric potential of the sensing electrode and the reference potential is inverted,
    wherein the charge and discharge circuits of the specific capacitance-time conversion means connected to respective ones of at least two or more specific sensing electrodes raise or reduce the electric potentials of the specific sensing electrodes with respect to the base point in time under the same charge control or the same discharge control, and
    wherein the input operation detecting means detects any of the specific sensing electrodes the input unit is approaching based on times for the binary data of the binary signals output from the comparison circuits of the specific capacitance-time conversion means to be inverted with respect to the base point in time.

2. The capacitive touch panel according to claim 1, wherein the plurality of sensing electrodes arranged on the insulating panel are divided into first specific sensing electrodes and second specific sensing electrodes;
    the respective charge and discharge circuits of first specific capacitance-time conversion means connected to respective ones of the first specific sensing electrodes perform the charge control to raise the electric potentials of the first specific sensing electrodes that are at the ground potential at a first base point in time, and the respective charge and discharge circuits of second specific capacitance-time conversion means connected to respective ones of the second specific sensing electrodes perform the discharge control to reduce the electric potentials of the second specific sensing electrodes that are at the charge potential at a second base point in time; and
    the input operation detecting means detects any of the first specific sensing electrodes the input unit is approaching based on time for binary data of a binary signal to be inverted with respect to the first base point in time, and detects any of the second specific sensing electrodes the input unit is approaching based on time for binary data of a binary signal to be inverted with respect to the second base point in time.

3. The capacitive touch panel according to claim 2, comprising a changeover switch for selectively connecting a common input of the input operation detecting means either to each output of the first specific capacitance-time conversion means, or to each output of the second specific capacitance-time conversion means, and wherein
    the changeover switch connects the common input of the input operation detecting means to the each output of the first specific capacitance-time conversion means when each of the charge and discharge circuits of the first specific capacitance-time conversion means performs the charge control and the changeover switch connects the common input of the input operation detecting means to the each output of the second specific capacitance-time conversion means when each of the charge and discharge circuits of the second specific capacitance-time conversion means perform the discharge control.

4. The capacitive touch panel according to claim 2, wherein the first specific sensing electrodes are a plurality of sensing electrodes arranged in one direction of the insulating panel, and the second specific sensing electrodes are a plurality of sensing electrodes arranged in a direction of the insulating panel perpendicular to the one direction.

5. The capacitive touch panel according to claim 4, comprising a changeover switch for selectively connecting a common input of the input operation detecting means either to each output of the first specific capacitance-time conversion means, or to each output of the second specific capacitance-time conversion means, and wherein the changeover switch connects the common input of the input operation detecting means to the each output of the first specific capacitance-time conversion means when each of the charge and discharge circuits of the first specific capacitance-time conversion means performs the charge control and the changeover switch connects the common input of the input operation detecting means to the each output of the second specific capacitance-time conversion means when each of the charge and discharge circuits of the second specific capacitance-time conversion means perform the discharge control.

6. The capacitive touch panel according to claim 1, the input operation detecting means determines a position of a specific sensing electrode having a highest stray capacitance among the specific sensing electrodes as an input position at which an input operation was made.

* * * * *